United States Patent
Majumdar et al.

(10) Patent No.: US 9,064,946 B1
(45) Date of Patent: Jun. 23, 2015

(54) III-V FET DEVICE WITH OVERLAPPED EXTENSION REGIONS USING GATE LAST

(71) Applicant: International Business Machines Corporation, Armonk, NY (US)

(72) Inventors: Amlan Majumdar, White Plains, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/623,732

(22) Filed: Feb. 17, 2015

Related U.S. Application Data

(62) Division of application No. 13/950,758, filed on Jul. 25, 2013.

(51) Int. Cl.
| | |
|---|---|
| H01L 29/66 | (2006.01) |
| H01L 29/778 | (2006.01) |
| H01L 29/201 | (2006.01) |
| H01L 29/205 | (2006.01) |
| H01L 29/49 | (2006.01) |

(52) U.S. Cl.
CPC .......... *H01L 29/7786* (2013.01); *H01L 29/201* (2013.01); *H01L 29/205* (2013.01); *H01L 29/4966* (2013.01)

(58) Field of Classification Search
CPC .. H01L 29/201; H01L 29/205; H01L 29/4966
USPC ....................................................... 257/192
See application file for complete search history.

(56) References Cited

U.S. PATENT DOCUMENTS

| | | | |
|---|---|---|---|
| 5,311,045 | A | 5/1994 | Baldwin et al. |
| 6,300,177 | B1 | 10/2001 | Sundaresan et al. |
| 7,579,234 | B2 | 8/2009 | Lin |
| 7,919,791 | B2 | 4/2011 | Flynn et al. |
| 2008/0171414 | A1 | 7/2008 | Kim |

(Continued)

FOREIGN PATENT DOCUMENTS

EP 1488460 B1 2/2013

OTHER PUBLICATIONS

E.F. Schubert, "Delta doping of III-V Compound semiconductors: Fundamentals and device applications", J. Vac. Sci, Technol. A vol. 8 No. 3, May/Jun. 1990, pp. 2980-2996.

(Continued)

*Primary Examiner* — Ajay K Arora
(74) *Attorney, Agent, or Firm* — Steven M. Kellner; Louis J. Percello

(57) ABSTRACT

A structure and method for fabricating a III-V compound semiconductor-containing heterostructure field-effect transistor (FET) with self-aligned and overlapped extensions using a gate last process is disclosed. The a III-V compound semiconductor-containing heterostructure field-effect transistor (FET) structure may be formed by forming a III-V compound semiconductor-containing heterostructure having at least one layer; forming a doped contact layer on the III-V compound semiconductor-containing heterostructure; and forming a gate structure having a bottom surface substantially below an upper surface of the III-V compound semiconductor-containing heterostructure and an upper surface above the doped contact layer. An undoped region may be formed below the bottom surface of the T-shaped gate structure on a layer of the III-V compound semiconductor-containing heterostructure.

17 Claims, 8 Drawing Sheets

(56) References Cited

U.S. PATENT DOCUMENTS

2008/0296622 A1\* 12/2008 Kiewra et al. ................. 257/194
2010/0148153 A1   6/2010 Hudait et al.
2011/0147713 A1\* 6/2011 Pillarisetty et al. ............. 257/24
2013/0082308 A1   4/2013 Cheng et al.

OTHER PUBLICATIONS

Pending U.S. Appl. No. 13/950,758, filed Jul. 25, 2013, entitled: "III-V FET Device with Overlapped Extension Regions Using Gate Last".

\* cited by examiner

III-V FET DEVICE WITH OVERLAPPED EXTENSION REGIONS USING GATE LAST

FIELD

The present invention relates generally to the fabrication of integrated circuits, and more particularly, to a structure and method for fabricating a III-V compound semiconductor-containing heterostructure field-effect transistor (FET) with self-aligned and overlapped extensions using a gate last process.

BACKGROUND

Compound III-V semiconductors are receiving renewed attention for use as channel materials for advanced ultra large scale integration (ULSI) digital logic applications due to their high electron hole mobility. For example, the InGaAs/InAlAs material system is one of the most promising material systems for this application due to its large conduction-band offsets and high carrier mobility. Schottky-gated InGaAs high electron mobility transistors (III-V HEMTs) grown on InP substrates have produced maximum transconductance $g_m$ values and have been shown to compare favorably in terms of a power-delay product.

Conventional III-V HEMTs are self-aligned structures in which the physical length of the gate structure equals the effective length of the channel. However, in III-V HEMTs, gate leakage due to a lack of gate dielectric is an important factor limiting their performance reliability. Thus, a thin gate dielectric layer is often inserted between the gate metal and the wide bandgap barrier layer forming a III-V metal-oxide semiconductor HEMT (III-V MOS-HEMT) or a III-V metal-oxide semiconductor field-effect transistor (III-V MOSFET). The use of a gate dielectric layer has the beneficial effect of reducing gate leakage. III-V MOS-HEMTs and III-V MOSFETs devices exhibit a leakage reduction of six to ten orders of magnitude compared to a Schottky barrier HEMT of similar design. However, the use of a gate dielectric has the deleterious effect of reducing the transconductance because of a larger gate-to-channel separation. Furthermore, decrease of gate-to-source capacitance may cause a shift of threshold voltage (Vt) for devices with a doped channel.

One limitation with conventional self-aligned III-V MOS-HEMTs and III-V MOSFETs is that they are underlapped (i.e., the effective length of the channel is larger than the physical length of the gate structure) due to the fact that ion implantation techniques used in conventional silicon-based MOSFETs to create overlapped devices are not viable for III-V materials. In III-V devices, damage created from ion implantation and subsequent rapid thermal anneal (RTA) can lead to strain relaxation, which degrades the transport properties of III-V materials. Conventional methods to manage the problem of strain relaxation have involved keeping the RTA temperature low, but this leads to an insufficient diffusion and insufficient activation of implanted ions.

SUMMARY

According to one embodiment of the present invention, a method of forming a semiconductor device is disclosed. The method may involve forming a III-V compound semiconductor-containing heterostructure having at least one layer; forming a doped contact layer on the III-V compound semiconductor-containing heterostructure; and forming a gate structure having a bottom surface substantially below an upper surface of the III-V compound semiconductor-containing heterostructure and an upper surface above the doped contact layer. An undoped region may be formed below the bottom surface of the T-shaped gate structure on a layer of the III-V compound semiconductor-containing heterostructure.

In another embodiment, a method of forming a semiconductor device is disclosed. The method of forming the semiconductor device may include: forming a III-V compound semiconductor-containing heterostructure having at least one layer; forming a doped contact layer on the III-V compound semiconductor-containing heterostructure; forming a dielectric layer on the doped contact layer; forming a gate trench extending from an upper surface of the dielectric layer, through the doped contact layer, to a barrier layer that is substantially below an upper surface of the III-V compound semiconductor-containing heterostructure; forming gate spacers having an upper surface that is substantially flush with the upper surface of the dielectric layer on sidewalls of the gate trench and on the barrier layer; forming a gate region by removing the barrier layer from the region of the gate trench between the gate spacers; and forming a gate structure having an upper surface that is substantially flush with the upper surface of the gate spacers in the gate region. An undoped region may be formed below the bottom surface of the T-shaped gate structure on a layer of the III-V compound semiconductor-containing heterostructure.

In another embodiment, a structure of a semiconductor device is disclosed. The semiconductor structure may include a III-V compound semiconductor-containing heterostructure having at least one layer; a doped contact layer on the III-V compound semiconductor-containing heterostructure; a dielectric layer on the doped contact layer; a gate structure having an upper surface that is substantially flush with an upper surface of the dielectric layer and having a bottom surface on a channel layer that is substantially below an upper surface of the III-V compound semiconductor-containing heterostructure; and gate spacers having an upper surface that is substantially flush with the upper surface of the dielectric layer on an upper surface of the barrier layer adjacent to and contacting the gate structure. The structure may also include an undoped region below the bottom surface of the T-shaped gate structure on the channel layer of the III-V compound semiconductor-containing heterostructure.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Two embodiments by which to achieve self-aligned overlapped extensions in a III-V compound semiconductor-containing heterostructure FETs are described in detail below by referring to the accompanying drawings FIGS. 1-6B. Process steps and structures common to both embodiments are described in detail by FIGS. 1-4, while one embodiment is described in detail by FIGS. 5A-5B and another is described in detail by FIGS. 6A-6B.

In the present invention, the term "III-V compound semiconductor" denotes a semiconductor material that includes at least one element from Group III of the Periodic Table of Elements and at least one element from Group V of the Periodic Table of Elements. Typically, each of the III-V compound semiconductor layers is a binary, ternary, or quaternary III-V containing compound. Examples of III-V compound semiconductors that can be used in the present invention include, but are not limited to, alloys of InGaAs, InAlAs, InAlAsSb, InAlAsP, and InGaAsP.

Figure 1:
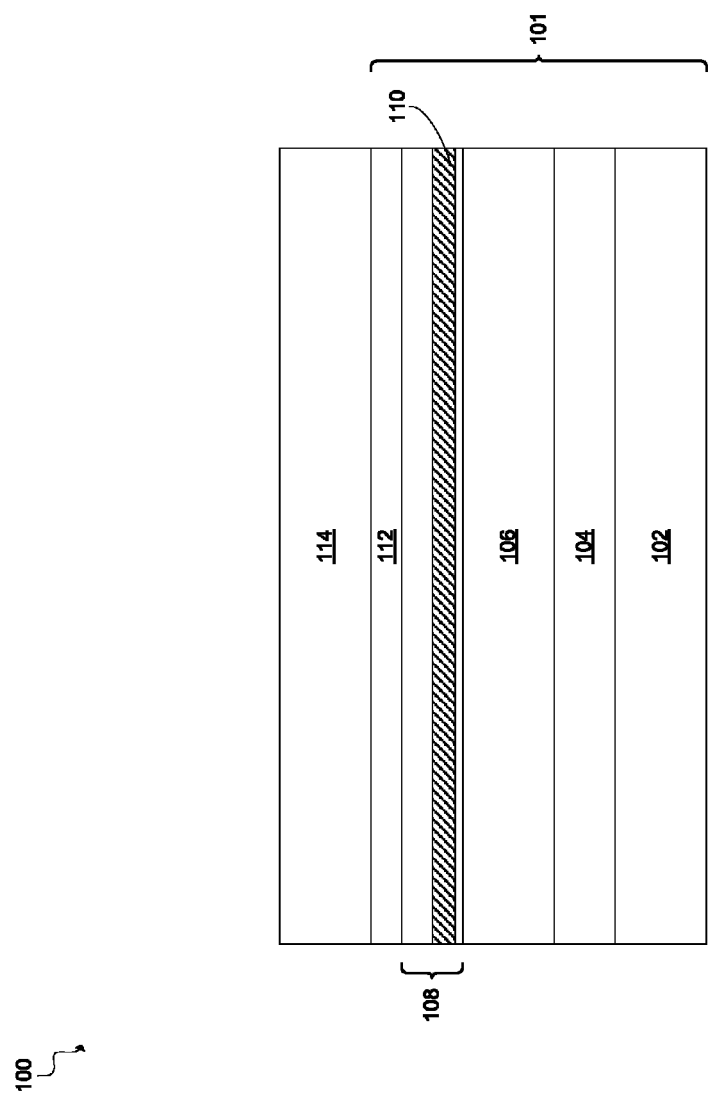
FIG. 1 is a cross sectional view of a III-V compound semiconductor-containing heterostructure and a doped contact layer formed on a semiconductor substrate, according to an embodiment of the present invention.

Referring to FIG. 1, an initial structure 100 may be used in one embodiment of the present invention. Structure 100 may include a III-V compound semiconductor-containing heterostructure 101 formed on top of a semiconductor substrate 102. The III-V compound semiconductor-containing heterostructure 101 may include a III-V compound semiconductor buffer layer 104 having a first bandgap, a III-V compound semiconductor channel layer 106 having a second bandgap located on a upper surface of the buffer layer 104, a III-V compound semiconductor barrier layer 108 having a third bandgap located on an upper surface of the channel layer 106, and an etch stop layer 112 on an upper surface of the barrier layer 108. A doped contact layer 114 may be formed on the III-V compound semiconductor-containing heterostructure 101.

In the present embodiment, the barrier layer 108 may include a delta doped region 110 that is located in a lower region of the barrier layer 108 abutting next to, but not in direct contact with, the interface with the underlying channel layer 106. The dopant atom present in the delta doped region 110 may be an n-type dopant (i.e., an element from Group IV or VI of the Periodic Table of Elements) or a p-type dopant (i.e., an element from Group II or IV of the Periodic Table of Elements). The concentration of dopant in the delta doped region 110 may be approximately $10^{11}$ atom/cm$^2$ to approximately $10^{13}$ atom/cm$^2$.

The semiconductor substrate 102 may include any semiconductor material including, for example, Si, SiGe, SiGeC, SiC, Ge alloys, Ga, GaAs, InAs, InP, Ge, and all other III-V compound semiconductors. The semiconductor substrate 102 may be composed of a layered semiconductor material such as, for example, a semiconductor-on-insulator substrate. The semiconductor substrate 102 may be doped, undoped, or contain doped and undoped regions therein. The semiconductor substrate 102 may have a single crystal orientation or it may have surface regions that have different crystal orientation. The semiconductor substrate 102 may be strained, unstrained, or a combination thereof.

The bandgap of the barrier layer 108 (i.e., the third bandgap) may be larger (wider) than the bandgap of the channel layer 106 (i.e., the second bandgap). As stated above, the term "bandgap" refers to the energy difference between the top of the valance band (i.e., $E_v$) and the bottom of the conduction band (i.e., $E_c$). The barrier layer 108 may be composed of a III-V compound semiconductor having a bandgap value that is from approximately 0.5 times to approximately 10 times larger than the bandgap of the III-V compound semiconductor material used in the channel layer 106. In a preferred embodiment, the barrier layer 108 may be composed of a III-V compound semiconductor having a bandgap value that is from approximately 1 times to approximately 5 times larger than the bandgap of the III-V compound semiconductor material used in the channel layer 106.

The bandgap of the buffer layer 104 (i.e., the first bandgap) may also be larger than that of the channel layer 106. This helps confine the electrons within the channel layer 106. The buffer layer 104 may be composed of a III-V compound semiconductor having a bang gap value that is from approximately 0.5 times to approximately 10 times larger than the bandgap of the III-V semiconductor material used in the channel layer 106. In one embodiment, the buffer layer 104 may be composed of a III-V compound semiconductor having a bang gap value that is from approximately 1 times to approximately 5 times larger than the bandgap of the III-V semiconductor material used in the channel layer 106.

It is noted that the bandgap of the buffer layer 104 and the bandgap of the barrier layer 108, which may be larger than the bandgap of the channel layer 106, do not necessarily have the same value. Since wide bandgap materials are used for the barrier layer 108 and buffer layer 104, and a narrow bandgap material is used for the channel layer 106, carriers are confined to the channel layer 106 under certain gate bias range. The carriers may be confined in the channel layer 106 when typical gate bias conditions are applied.

In one embodiment of the present invention, the barrier layer 108 and the buffer layer 104 may be composed of an alloy of InAlAs, while the channel layer 106 may be composed of an alloy of InGaAs. By "alloy of InAlAs" it is meant a composition of $In_xAl_{1-x}As$ wherein x is from approximately 0 to approximately 1, and more preferably from approximately 0.4 to approximately 0.6. By "alloy of InGaAs" it is meant a composition of $In_yGa_{1-y}As$ wherein y is from approximately 0 to approximately 1, and more preferably from approximately 0.3 to approximately 0.8. It is noted that each of the III-V compound semiconductor layers employed in the present invention may be a single crystal material of typical commercial quality. The typical commercial quality of the III-V compound semiconductor layers is a result of utilizing an epitaxial growth process such as, for example, molecular beam epitaxy (MBE) or metalorganic chemical vapor deposition (MOCVD). The III-V compound semiconductor layers may be epitaxially grown utilizing III/V-containing precursors that are well known to those skilled in the art. In some embodiments, a graded III-V compound semiconductor layer can be formed.

When a delta doped region 110 is formed into the lower region of the barrier layer 108, an in-situ doping deposition process may be used in which the dopant atom is introduced during the initial formation of the barrier layer 108 and following the formation of a desired thickness of the delta doped region 110 (approximately 0.1 nm to approximately 2.0 nm), the dopant is removed from the precursor stream and the barrier layer 108 formation continues. Alternatively, the delta doped region 110 may be formed utilizing ion implantation after the barrier layer 108 has been formed. The conditions of such an implant are selected to provide a delta doped region next to, but not in contact with, the interface 107 of the underlying channel layer 106.

The doped contact layer 114 may be may be formed by an epitaxial growth process. As used herein, the terms "epitaxially formed," "epitaxial growth," and/or "epitaxial deposition" mean the growth of a crystalline semiconductor material on a deposition surface. During the epitaxial growth process, chemical reactants are controlled and system parameters are set so that depositing atoms arrive at the deposition surface with sufficient energy to move around on the surface and orient themselves to the crystal arrangement of the atoms of the deposition surface. The doped contact layer 114 may be formed by the epitaxial growth of a III-V compound semiconductor. The doped contact layer 114 may also be formed by the epitaxial growth of silicon or germanium. In another embodiment, the doped contact layer 114 may be composed of SiGe.

In one embodiment, a portion of the doped contact layer 114 may be in-situ doped with a p-type conductivity dopant during the selective epitaxial growth process. P-type semiconductor devices (PFETs) in III-V materials are typically produced by doping the source-drain regions with a p-type dopant composed of elements from: group II of the Periodic Table of Elements, including beryllium or magnesium, that replace a group III atom; or group IV of the Periodic Table of Elements, including carbon, that replace a group V atom. In one embodiment, the doped contact layer 114 may have a p-type dopant in a concentration ranging from approximately $1 \times 10^{19}$ atoms/cm$^3$ to approximately $5 \times 10^{21}$ atoms/cm$^3$. In another embodiment, the p-type conductivity dopant may be introduced to the doped contact layer 114 using ion implantation following the epitaxial growth process that is used to form the doped contact layer 114.

The doped contact layer 114 may also be in-situ doped with an n-type conductivity dopant during the selective epitaxial growth process. N-type semiconductor devices (NFETs) in III-V materials are typically produced by doping the source-drain regions with a dopant composed of elements from: group IV of the Periodic Table of Elements, including silicon or germanium, that replace a group III atom; or (ii) group VI of the Periodic Table of Elements, including sulfur, selenium, or tellurium, that replace a group V atom. In one embodiment, the doped contact layer 114 may have a n-type dopant in a concentration ranging from approximately $1 \times 10^{19}$ atoms/cm$^3$ to approximately $5 \times 10^{21}$ atoms/cm$^3$. In another embodiment, the n-type conductivity dopant may be introduced to the doped contact layer 114 using ion implantation following the epitaxial growth process that is used to form the doped contact layer 114.

Each of the individual III-V compound semiconductor layers shown in FIG. 1 are thin (providing a total thickness of less than approximately 600 nm). The buffer layer 104 may have a thickness of approximately 5 nm to approximately 500 nm. The channel layer 106 may have a thickness of approximately 2 nm to approximately 10 nm. The barrier layer 108 may have a thickness of approximately 1 nm to approximately 5 nm. The etch stop layer 112 may have a thickness of approximately 1 nm to approximately 2 nm. The doped contact layer 114 may have a thickness of approximately 10 nm to approximately 30 nm.

Figure 2:
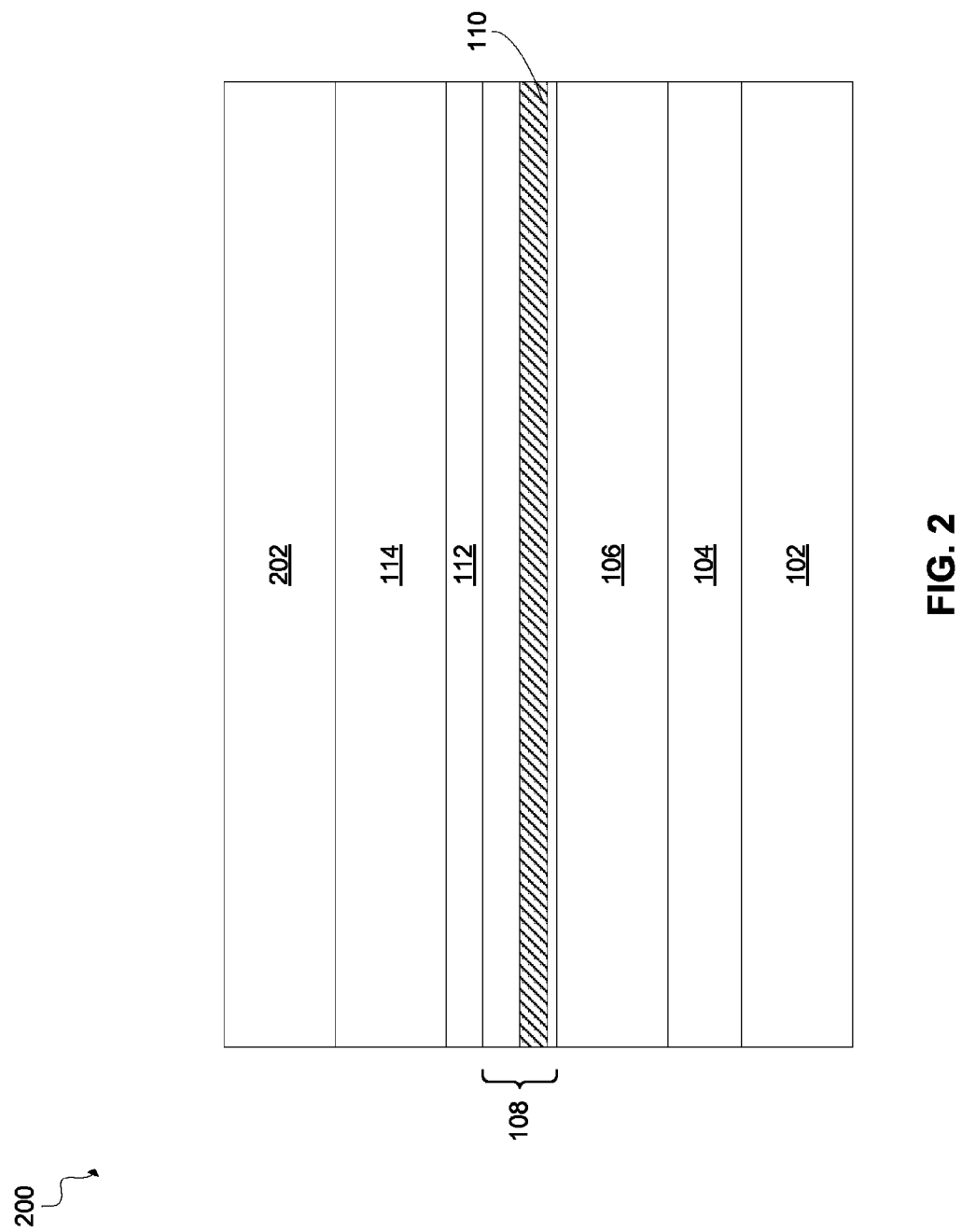
FIG. 2 is a cross sectional view illustrating the formation of a dielectric layer, according to an embodiment of the present invention.

Referring now to FIG. 2, a structure 200 is illustrative of a dielectric layer 202 formed on the doped contact layer 114. The dielectric layer 202 may be formed utilizing a conventional deposition process including, but not limited to, depositing dielectric material using molecular beam epitaxy (MBE), chemical vapor deposition (CVD), plasma enhanced CVD (PECVD), atomic layer deposition (ALD), evaporation, physical vapor deposition (PVD), chemical solution deposition, and other like deposition processes. The dielectric material may be deposited on the doped contact layer 114 using a blanket deposition process and then planarized using a conventional process such as, for example, chemical mechanical planarization (CMP).

In one embodiment, the dielectric layer 202 may by composed of a low-k dielectric material including, but not limited to, an oxide and/or silicates including metal silicates, aluminates, and titanates. A "low-k" material is a dielectric material with a lower dielectric constant relative to silicon dioxide ($SiO_2$), which is 3.9 (i.e., the ration of the permittivity of $SiO_2$ divided by the permittivity of a vacuum). In an embodiment in which the dielectric layer 202 is composed of an oxide, the oxide may selected from the group including, but not limited to, $SiO_2$, $HfO_2$, $ZrO_2$, $Al_2O_3$, $TiO_2$, $La_2O_3$, $SrTiO_3$, $LaA_1O_3$, $Y_2O_3$, and mixtures thereof. In another embodiment, the dielectric layer 202 may be composed of a dielectric material with a dielectric constant ranging from approximately 4.0 to approximately 7.0. In such an embodiment, the dielectric layer 202 may be composed of an oxide, including, but not limited to, silicon oxide, carbon doped silicon oxide, fluorine doped silicon oxide, hydrogen silsesquioxane polymer (HSQ), methyl silsesquioxane polymer (MSQ), polyphenylene oligomer, methyl doped silica, $SiO_x(CH_3)_y$, $SiC_xO_yH_y$, organosilicate glass (SiCOH), porous SiCOH, and mixtures thereof.

Figure 3:
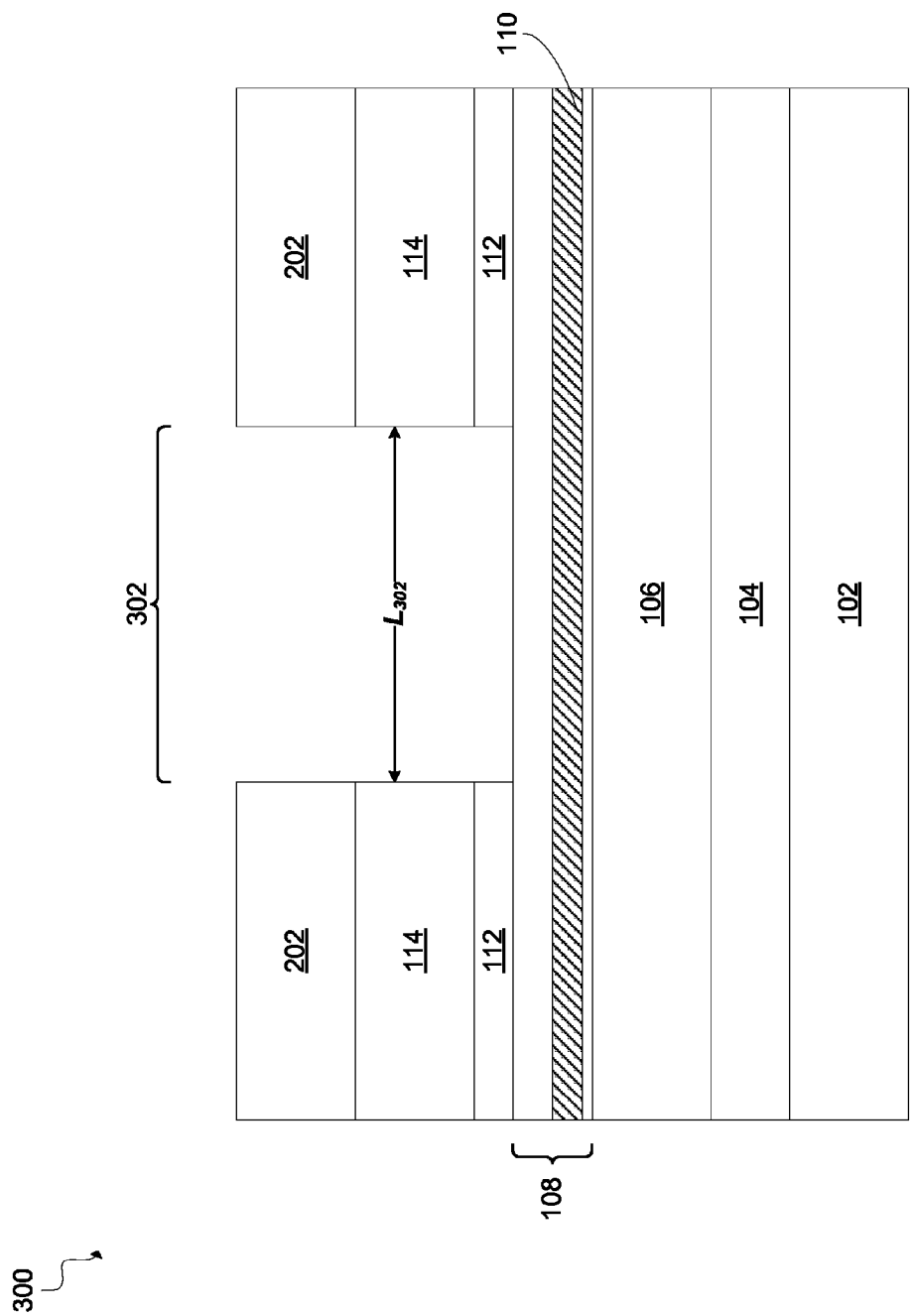
FIG. 3 is a cross sectional view illustrating the formation of a gate trench, according to an embodiment of the present invention.

Referring now to FIG. 3, a gate trench 302 may be formed by etching the dielectric layer 202, the doped contact region 114, and the etch stop layer 112 to form a structure 300. In a preferred embodiment, the dielectric layer 202, the doped contact region 114, and the etch stop layer 112 may be patterned and etched to desired dimensions. Standard masking and photolithography techniques may be implemented to pattern the gate trench 302 onto the surface of the dielectric layer 202. Subsequently, standard etching techniques, such as, reactive ion etching (RIE), selective to the barrier layer 108 may then be implemented to etch the gate trench 302 into the dielectric layer 202, the doped contact region 114, and the etch stop layer 112. In a preferred embodiment, the gate trench 302 may have a length $L_{302}$ that is the desired gate length plus two times the length of each desired gate spacer 402 (shown in FIG. 4). Therefore, $L_{302}=L_g+2L_{gs}$, where $L_g$ is the desired physical gate length and $L_{gs}$ is the desired length of each gate spacer.

Figure 4:
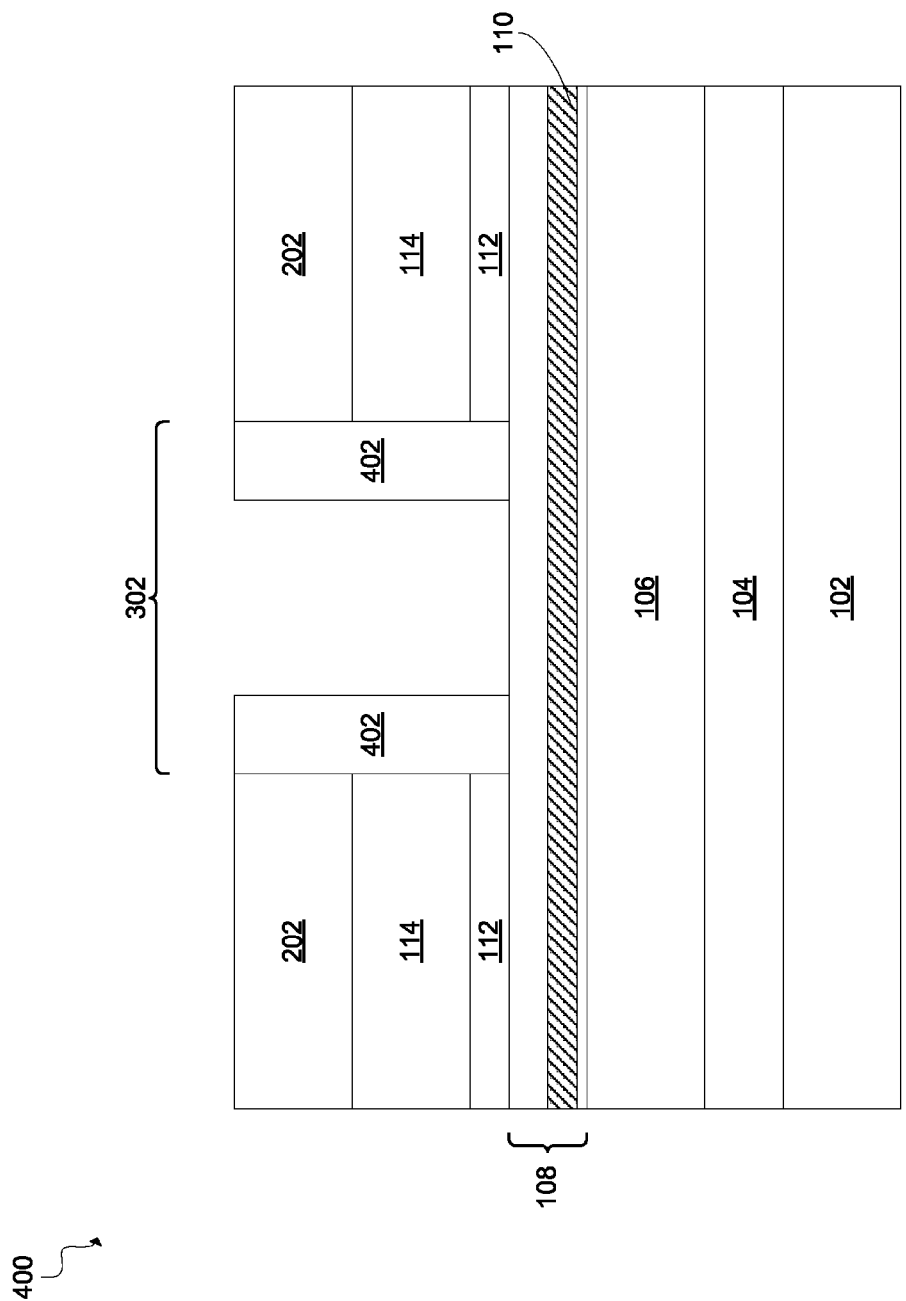
FIG. 4 is a cross sectional view illustrating the formation of gate spacers, according to an embodiment of the present invention.

Referring now to FIG. 4, a pair of gate spacers 402 (hereinafter "gate spacers") may be formed on an upper surface of the barrier layer 108 and vertical sides of the gate trench 302 to form a structure 400. In one embodiment, the gate spacers 402 may be composed of a nitride. The gate spacers 402 may be formed by depositing a conformal layer of nitride, or by bulk deposition, on dielectric layer 202, the doped contact layer 114, the etch stop layer 112, and the barrier layer 108 by standard deposition techniques such as, but not limited to, CVD, PECVD, PVD, MOCVD, ALD, low pressure CVD (LPCVD), evaporation, reactive sputtering, chemical solution deposition, or any other suitable deposition process. Subsequently, an anisotropic etch, such as RIE, may be performed to removed the deposited layer from horizontal surfaces of the dielectric layer 202 and barrier layer 108, leaving the gate spacers 402 present on the vertical sidewalls of the gate trench 302. The deposited layer of gate spacer material may be etched so that the upper surface of the gate spacers 402 is substantially flush with an upper surface of the dielectric layer 202. In another embodiment, the gate spacers 402 may be planarized through a conventional process such as CMP so that the upper surface of the gate spacers 402 is substantially flush with an upper surface of the upper surface of the dielectric layer 202.

Figure 5A:
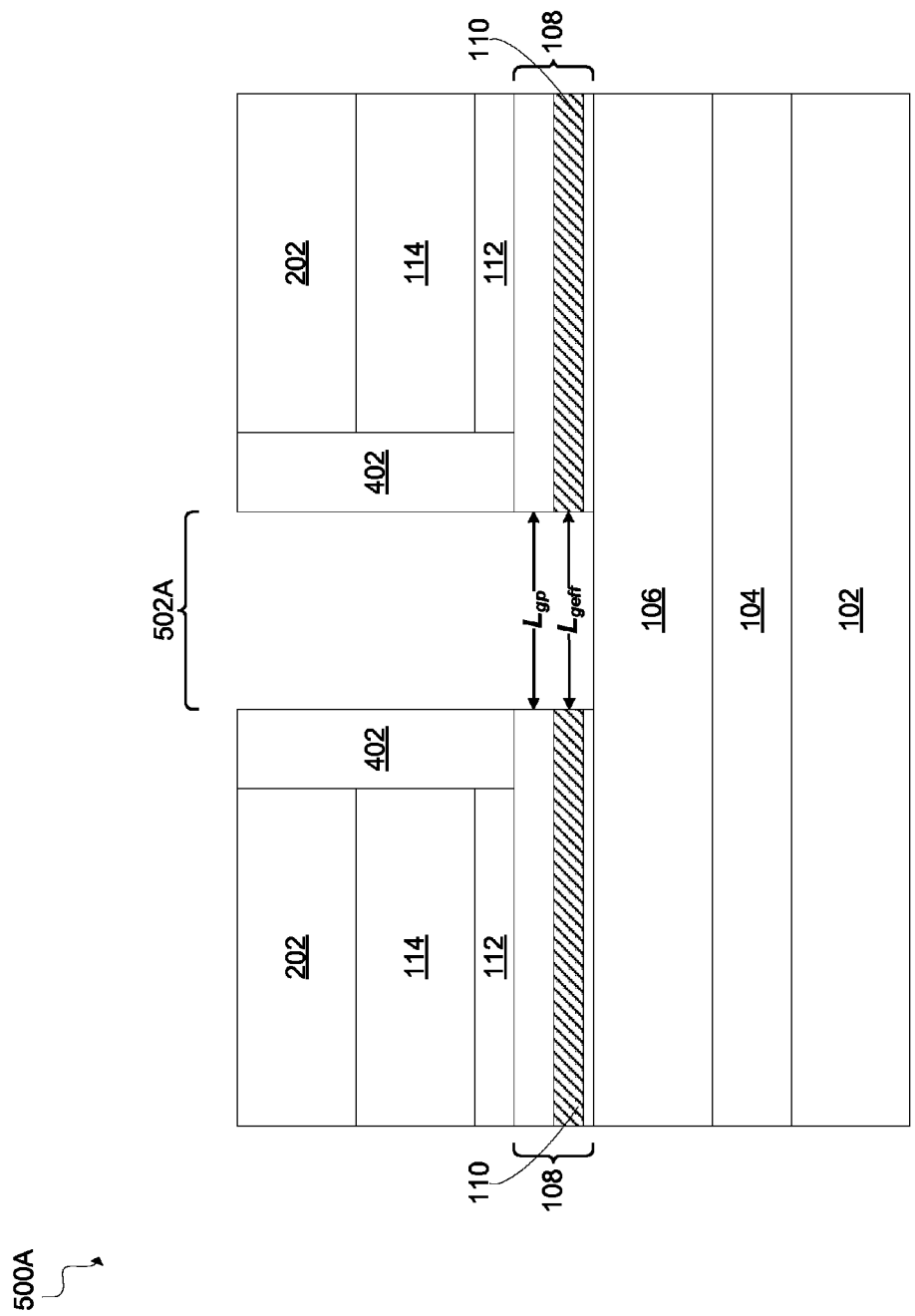
FIG. 5A is a cross sectional view illustrating the removal of an etch stop layer and barrier layer, according to an embodiment of the present invention.

Referring now to FIG. 5A, the entirety of the barrier layer 108, including the delta doped region 110, may be removed from the portion of the gate trench 302 not covered by the gate spacers 402 to form a gate region 502A in a structure 500A. In one embodiment, the entirety of the barrier layer 108, including the delta doped region 110, in the portion of the gate trench 302 not covered by the gate spacers 402 may be removed by a conventional etching process selective to the channel layer 106 such as, for example, RIE. The outer edges of the gate region 502A may be self-aligned to the barrier layer 108, including the delta doped region 110, resulting in an effective gate length $L_{geff}$ that may be equal to the physical gate length $L_{gp}$. In other words, there may be available electrons present in the regions below the gate spacers 402 that border the gate region 502A.

Figure 5B:
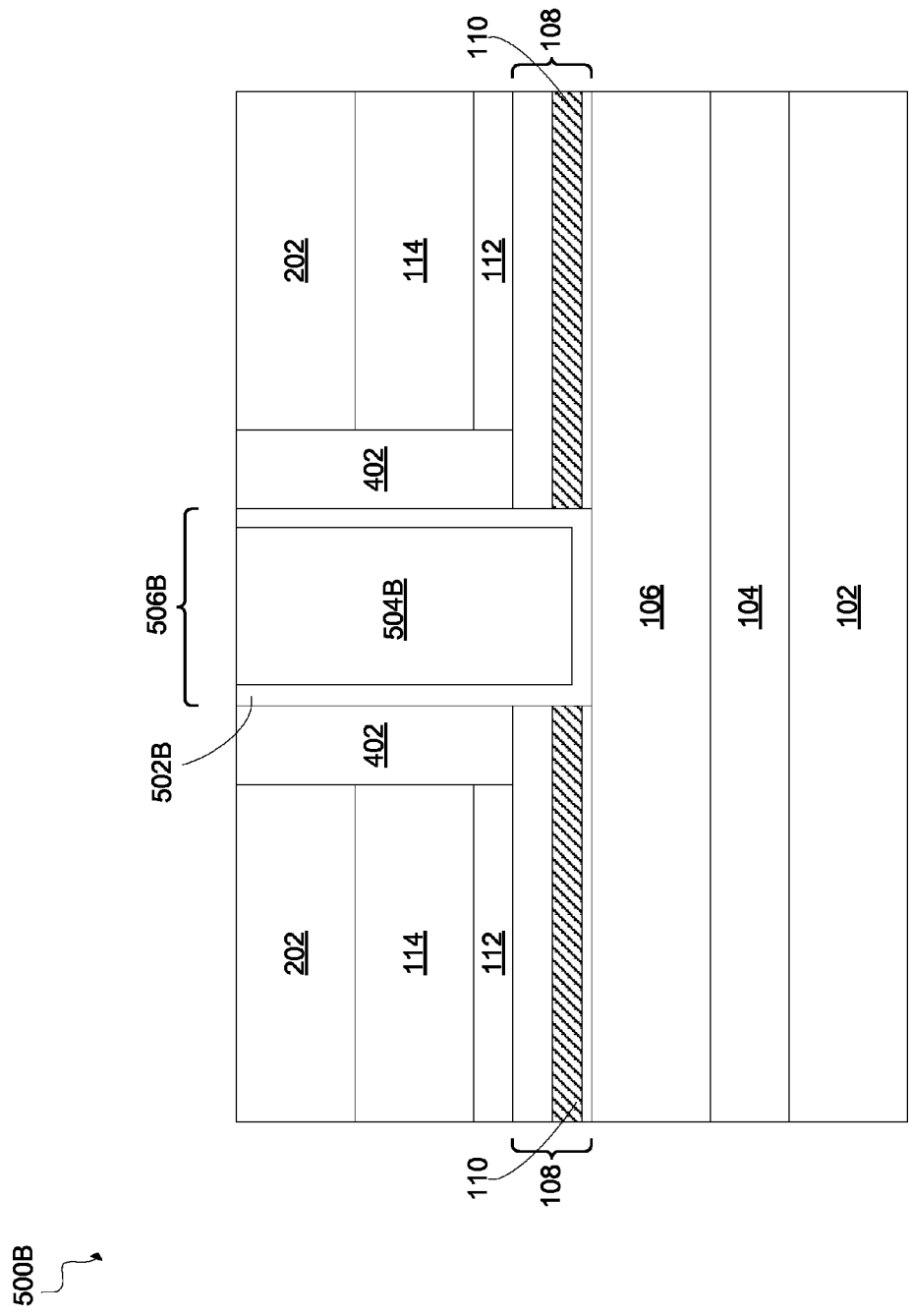
FIG. 5B is a cross sectional view illustrating the formation of a gate structure, according to an embodiment of the present invention.

Referring now to FIG. 5B, a gate dielectric layer 502B and a gate conductor 504B may be deposited and planarized in the gate region 502A to form a gate structure 506B on the III-V MOSFET structure 700B. The gate dielectric layer 502B may be composed of a dielectric material having a dielectric constant of greater than approximately 4.0; such a dielectric material is referred to hereafter as a high-k dielectric material.

The gate dielectric layer 502B may be composed of a high-k dielectric material having a dielectric constant of greater than approximately 7.0. In a preferred embodiment, the gate dielectric layer 502B may be composed of a high-k dielectric material having a dielectric constant of greater than approximately 10.0. The dielectric constants mentioned herein are relative to a vacuum, unless otherwise stated. The gate dielectric layer 502B may be composed of a high-k dielectric material including, but not limited to: an oxide, nitride, oxynitride and/or silicates including metal silicates, aluminates, titanates, and nitrides. In one embodiment, the gate dielectric layer 502B may be composed of $HfO_2$, $ZrO_2$, $Al_2O_3$, $TiO_2$, $La_2O_3$, $SrTiO_3$, $LaA_1O_3$, $Y_2O_3$, a pervoskite oxide, HfSiOz, $HfAlO_z$, or $HfAlO_a$Nb. The gate dielectric layer 502B may be formed utilizing a conventional deposition process including, but not limited to, MBE, CVD, PECVD, ALD, evaporation, PVD, chemical solution deposition, and other like deposition processes.

The thickness of the gate dielectric layer 502B may vary depending on the deposition technique employed in forming the same as well as the composition and number of dielectrics of the gate dielectric layer 502B. Typically, the gate dielectric layer 502B may have a thickness of approximately 0.5 nm to approximately 20 nm.

The gate conductor 504B may be composed of any conductive material such as, for example: polysilicon, polysilicon germanium, conductive metals, conductive metal alloys, conductive silicides, conductive nitrides, and combinations or multilayers thereof. When metallic-containing gate conductors are employed, the metallic gate conductor can be doped so as to shift the workfunction of the gate conductor. Illustrative examples of dopant ions include As, P, B, Sb, Bi, Al, Ga, Ti, or mixtures thereof. The same dopants may be used with the polysilicon or polySiGe mentioned above. In a preferred embodiment, the gate conductor 504B is a conductive metal such as Al, Pt, Au, W, and Ti. The gate conductor 504B may be formed by a conventional deposition process such as, for example, CVD, PECVD, PVD, plating, thermal or ebeam evaporation, and sputtering.

In one embodiment, after the gate dielectric layer 502B and a gate conductor 504B are deposited they may be planarized using a conventional process such as, for example, CMP, so that an upper surface of the gate structure 506B is substantially flush with the upper surface of the dielectric layer 202.

Figure 6A:
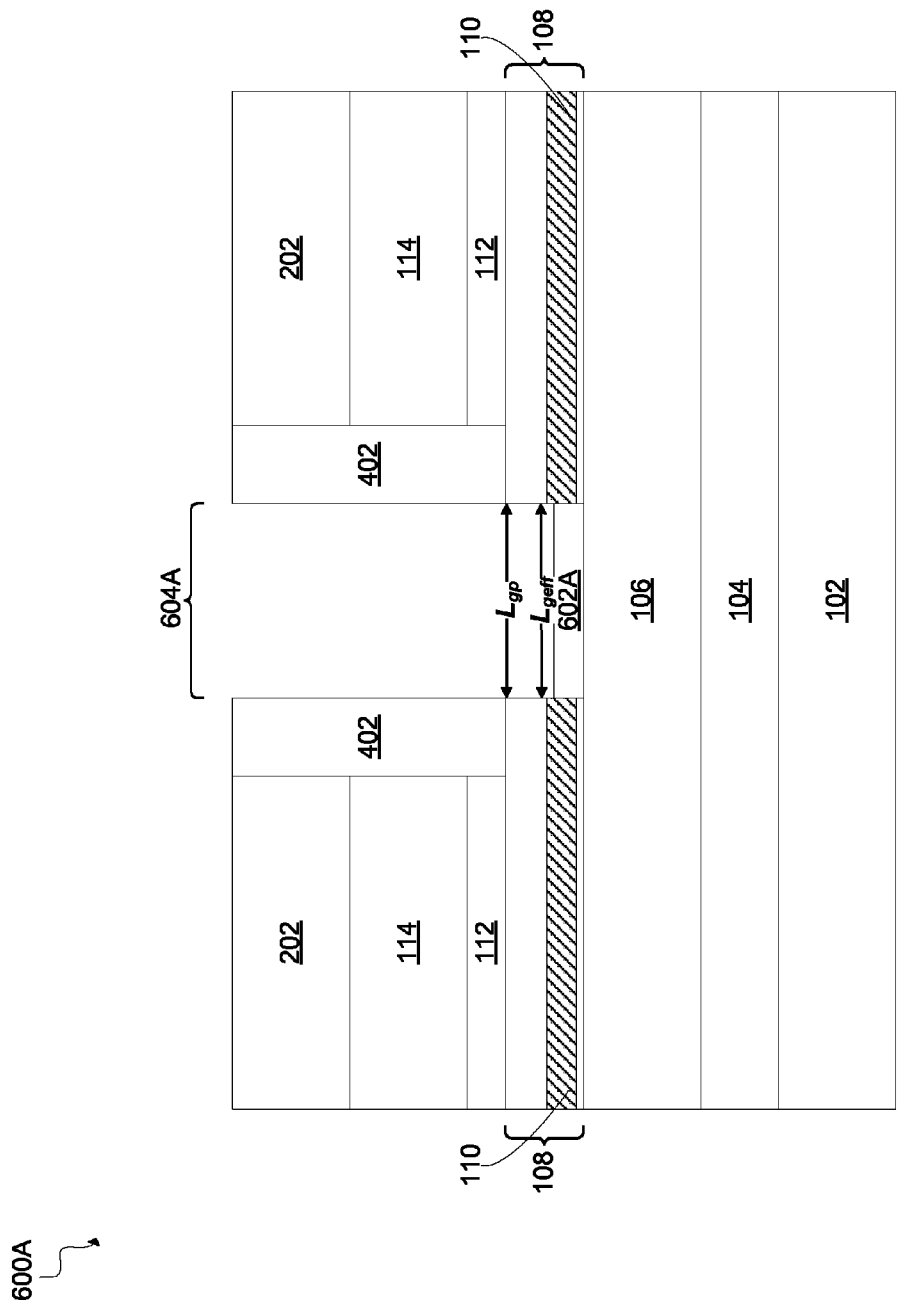
FIG. 6A is a cross sectional view illustrating the formation of an undoped region, according to an embodiment of the present invention.

Referring now to FIG. 6A, and in another embodiment, a structure 600A shows an undoped region 602A epitaxially grown on the exposed upper surface of the channel layer 106 to form a gate region 604A. The undoped region 602A may be composed of the same material as the barrier layer 108 and grown through an epitaxial growth process that is selective to the channel layer 106 (i.e., does not result in epitaxial growth on the dielectric layer 202, the gate spacers 402, or the barrier layer 108). The undoped region 602A may have a thickness of approximately 1 nm to approximately 2 nm. The outer edges of the gate region 604A may be self-aligned to the barrier layer 108, including the delta doped region 110, resulting in an effective gate length $L_{geff}$ that may be equal to the physical gate length $L_{gp}$. In other words, there may be available electrons present in the regions below the gate spacers 402 that border the gate region 604A.

Figure 6B:
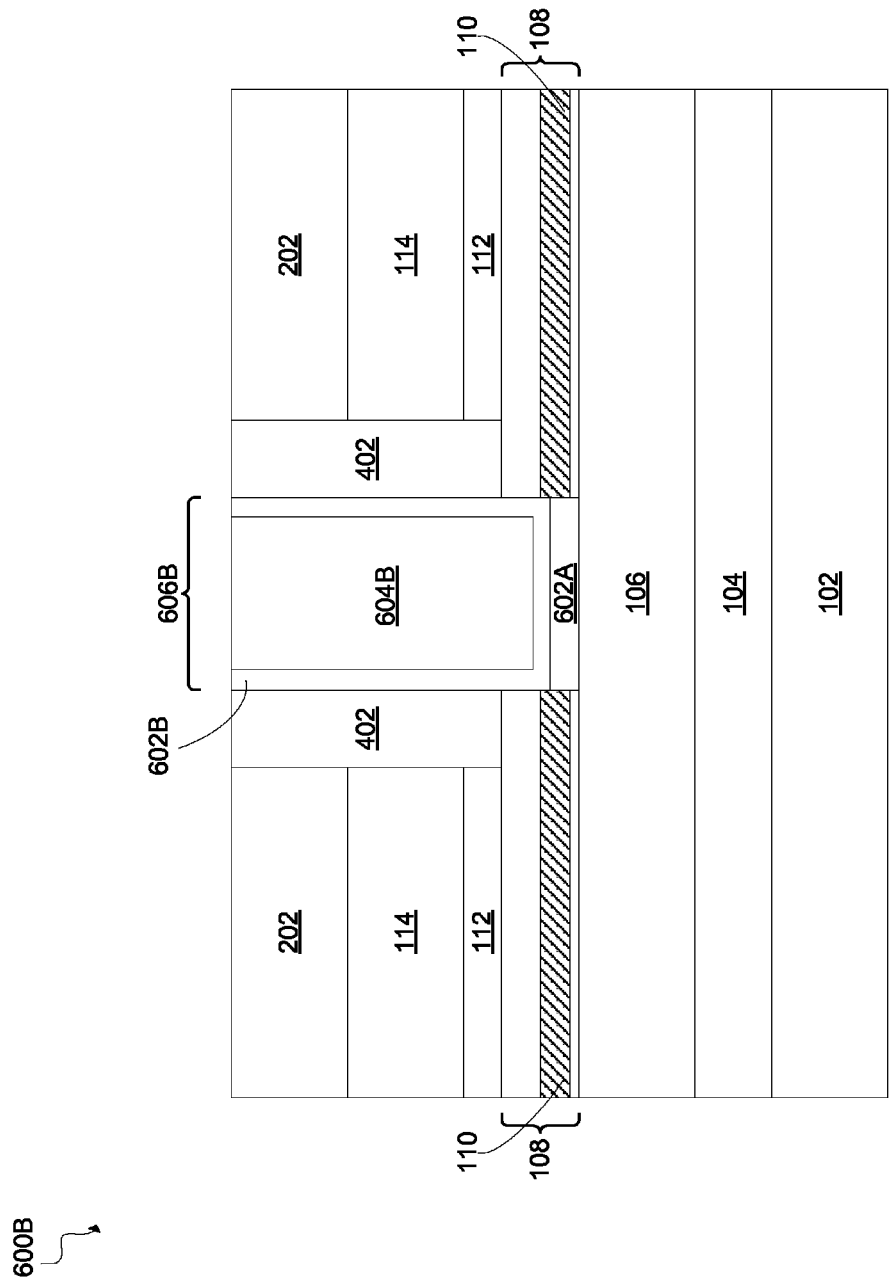
FIG. 6B is a cross sectional view illustrating the formation of a gate structure, according to an embodiment of the present invention.

Referring now to FIG. 6B, a III-V MOS-HEMT structure 600B may be formed by depositing a gate dielectric layer 602B and a gate conductor 604B in the gate region 604A (FIG. 6) and on the undoped region 602A to form a gate structure 606B using the same processes and techniques described above in reference to FIG. 5B. The gate dielectric layer 602B and gate conductor 604B may be composed of the same materials as the gate dielectric layer 502B and gate conductor 504B as described above in reference to FIG. 5B. The gate dielectric layer 602B and gate conductor 604B may be substantially similar to the gate dielectric layer 502B and the gate conductor 504B as described above with reference to FIG. 5B.

As described above, preferred embodiments of the present invention provide for self-aligned overlapped III-V MOSHEMTs and III-V MOSFETs using formation methods that avoid the problems associated with ion implantation in III-V devices such as strain relaxation and insufficient diffusion or activation of implanted ions.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure, comprising:
   a III-V compound semiconductor-containing heterostructure on a substrate, wherein the III-V compound semiconductor-containing comprises a buffer layer at above the substrate, a channel layer above and in contact with the buffer layer, and a barrier layer above and in contact with the channel layer;
   an etch stop layer above the barrier layer;
   a doped contact layer above the etch stop layer;
   a dielectric layer above the doped contact layer;
   a gate structure having a lowermost surface that is in contact with, and extends no further than, a lowermost surface of the barrier layer; and
   gate spacers on an uppermost surface of the barrier layer adjacent to and contacting the gate structure, the gate spacers having a lowermost surface that extends no further than the uppermost surface of the barrier layer.

2. The structure of claim 1, further comprising a delta-doped region above a bottom surface of the barrier layer containing dopant elements from Group IV, II, or VI of the Periodic Table of Elements.

3. The structure of claim 1, wherein the gate structure is comprised of a gate conductor formed on a gate dielectric layer.

4. The structure of claim 3, wherein the gate conductor comprises a metallic alloy.

5. The structure of claim 3, wherein the gate dielectric layer comprises a high-k dielectric material.

6. The structure of claim 1, wherein the gate spacers comprise a nitride.

7. The structure of claim 1, wherein the doped contact layer comprises silicon germanium doped with a p-type dopant.

8. The structure of claim 1, wherein the doped contact layer comprises silicon germanium doped with a n-type dopant.

9. A semiconductor structure, comprising:
   a III-V compound semiconductor-containing heterostructure on a substrate, wherein the III-V compound semiconductor-containing comprises a buffer layer at above the substrate, a channel layer above and in contact with the buffer layer, and a barrier layer above and in contact with the channel layer;
   an etch stop layer above the barrier layer;
   a doped contact layer above the etch stop layer;
   a dielectric layer above the doped contact layer;
   a gate structure having a lowermost surface that is in contact with, and extends no further than, a lowermost surface of the barrier layer;
   an undoped region between the gate structure and the channel layer; and
   gate spacers on an uppermost surface of the barrier layer adjacent to and contacting the gate structure, the gate spacers having a lowermost surface that extends no further than the uppermost surface of the barrier layer.

10. The structure of claim 9, further comprising a delta-doped region above a bottom surface of the barrier layer containing dopant elements from Group IV, II, or VI of the Periodic Table of Elements.

11. The structure of claim 9, wherein the gate structure is comprised of a gate conductor formed on a gate dielectric layer.

12. The structure of claim 11, wherein the gate conductor comprises a metallic alloy.

13. The structure of claim 11, wherein the gate dielectric layer comprises a high-k dielectric material.

14. The structure of claim 9, wherein the gate spacers comprise a nitride.

15. The structure of claim 9, wherein the doped contact layer comprises silicon germanium doped with a p-type dopant.

16. The structure of claim 9, wherein the doped contact layer comprises silicon germanium doped with a n-type dopant.

17. The structure of claim 9, wherein the undoped region comprises epitaxial III-V compound semiconductor material.

\* \* \* \* \*